United States Patent
Plettner et al.

(10) Patent No.: US 12,014,895 B2
(45) Date of Patent: Jun. 18, 2024

(54) MULTI-BEAM ELECTRONICS SCAN

(71) Applicant: KLA Corporation, Milpitas, CA (US)

(72) Inventors: Tomas Plettner, San Ramon, CA (US);
Doug Larson, Sunnyvale, CA (US);
Mark Cawein, Milpitas, CA (US);
Jason W. Huang, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/540,169

(22) Filed: Dec. 1, 2021

(65) Prior Publication Data
US 2022/0199352 A1  Jun. 23, 2022

Related U.S. Application Data

(60) Provisional application No. 63/129,559, filed on Dec. 22, 2020.

(51) Int. Cl.
*H01J 37/10* (2006.01)
*H01J 37/20* (2006.01)
*H01J 37/28* (2006.01)

(52) U.S. Cl.
CPC .............. *H01J 37/10* (2013.01); *H01J 37/20* (2013.01); *H01J 37/28* (2013.01)

(58) Field of Classification Search
CPC .. H01J 37/00; H01J 37/10; H01J 37/20; H01J 37/26; H01J 37/28; H01J 37/265; H01J 2237/1518; H01J 2237/20228; H01J 2237/2817; H01J 2237/31766
USPC ............... 250/306, 307, 311, 396 R
See application file for complete search history.

(56) References Cited

U.S. PATENT DOCUMENTS

| | | | |
|---|---|---|---|
| 6,946,657 B2 | 9/2005 | Kienzle et al. | |
| 6,977,375 B2 | 12/2005 | Yin et al. | |
| 9,824,860 B2 | 11/2017 | Yamada | |
| 2011/0272576 A1* | 11/2011 | Otaki | B82Y 40/00 250/306 |
| 2012/0241606 A1 | 9/2012 | Han et al. | |
| 2013/0216954 A1* | 8/2013 | Oishi | B82Y 10/00 430/296 |
| 2013/0299697 A1* | 11/2013 | Enyama | H01J 37/28 250/306 |

(Continued)

FOREIGN PATENT DOCUMENTS

| | | |
|---|---|---|
| JP | 2006080304 A | 3/2006 |
| WO | 2016036246 A2 | 3/2016 |
| WO | 2019238553 A1 | 12/2019 |

OTHER PUBLICATIONS

International Search Report and Written Opinion for PCT/US2021/064258, International Filing Date Dec. 19, 2021, mailed May 24, 2022, 8 pages.

*Primary Examiner* — Jason L McCormack
(74) *Attorney, Agent, or Firm* — Kwan & Olynick LLP

(57) ABSTRACT

A multi-beam electronics scanning system using swathing. The system includes an electron emitter source configured to emit an illumination beam. The illumination beam is split into multiple electron beams by a beam splitter lens array. The system also includes an electronic deflection system configured to deflect each of the electron beams in a plurality of directions, including a first direction, along two different axes. Last, a swathing stage is used to move a sample with a constant velocity in a second direction that is parallel to the first direction.

20 Claims, 12 Drawing Sheets

(56) References Cited

U.S. PATENT DOCUMENTS

| | | | |
|---|---|---|---|
| 2014/0175302 A1* | 6/2014 | Touya | B82Y 10/00 |
| | | | 250/398 |
| 2015/0187540 A1* | 7/2015 | Ito | H01J 37/3174 |
| | | | 250/491.1 |
| 2018/0031498 A1 | 2/2018 | Shiratsuchi et al. | |
| 2018/0254167 A1* | 9/2018 | Zhao | H01J 37/20 |

* cited by examiner

MULTI-BEAM ELECTRONICS SCAN

CROSS-REFERENCE TO RELATED APPLICATIONS

This application claims the benefit of prior application U.S. Provisional Application No. 63/129,559, filed Dec. 22, 2020, by Tomas Plettner et al., which is herein incorporated by reference in its entirety for all purposes.

TECHNICAL FIELD

The disclosure generally relates to the field of wafer inspection systems. More particularly the present disclosure relates to multi-beam scanning technology.

BACKGROUND

Generally, the industry of semiconductor manufacturing involves highly complex techniques for fabricating integrated circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device needs to be generally fault free prior to shipment to the end users or customers.

Conventional electronics scanning uses a simple single beam swathing technique. However, a single beam scanning system is slow and an inefficient because only a single beam is used to scan a large sample. Thus, some scanning approaches involve multi-column technology. However, using multi-column technology creates new problems. For example, multi-column scanning systems utilize multiple columns of electron beams. However, each column must be spaced far apart from another column because of the space requirements for each column. In addition, since each column requires its own parts, it is much more costly and complicated to use a multi-column system. Thus, there is a need for an improved electronics scanning system that addresses the complications mentioned above.

SUMMARY

The following presents a simplified summary of the disclosure in order to provide a basic understanding of certain embodiments of the disclosure. This summary is not an extensive overview of the disclosure and it does not identify key/critical elements of the disclosure or delineate the scope of the disclosure. Its sole purpose is to present some concepts disclosed herein in a simplified form as a prelude to the more detailed description that is presented later.

One aspect of the present disclosure is directed to a system. The system includes an electron emitter source configured to emit an illumination beam. The system also includes a beam splitter lens array configure to split the illumination beam into multiple electron beams. The system further includes an electronic deflection system configured to deflect each of the electron beams in a plurality of directions, including a first direction, along two different axes. Last, the system includes a swathing stage configured to move a sample with a constant velocity in a second direction that is parallel to the first direction.

Other aspects of the present disclosure are directed to a method and a computer readable medium storing instructions to execute the method. The method includes first emitting an illumination beam from an electron emitter source. Next, the method includes splitting the illumination beam into multiple electron beams using a beam splitter lens array. Third, the method includes deflecting, via an electronic deflection system, each of the electron beams in a plurality of directions, including a first direction, along two different axes. Last, the method includes moving a sample on a swathing stage at a constant velocity in a second direction that is parallel to the first direction.

In some embodiments, the electronic deflection system is further configured to deflect each electron beam along the first direction for a predetermined length of time or predetermined scanning distance. In some embodiments, the electronic deflection system is further configured such that after the electronic deflection system deflects an electron beam to the end of the predetermined length of time or predetermined scanning distance, the electronic deflection system will cause the electron beam to move in a third direction that is orthogonal or substantially orthogonal to the first direction. In some embodiments, the electronic deflection system is further configured such that after the electron beam moves in the third direction, the electronic deflection system causes the electron beam to move in a fourth direction that is parallel to the second direction. In some embodiments, the electronic deflection system is configured to write scan lines in groups of stacked rectangles from the perspective of the sample, wherein each rectangle comprises a predetermined number of scan lines. In some embodiments, each rectangle represents a scanned area of the sample, wherein each line adjacent to another line is written in the opposite direction from the other line. In some embodiments, the rectangles are written as parallelograms from the perspective of the electronic deflection system to account for constant velocity of the swathing stage.

These and other aspects of the disclosure are described further below with reference to the figures.

DETAILED DESCRIPTION OF EXAMPLE EMBODIMENTS

In the following description, numerous specific details are set forth in order to provide a thorough understanding of the present disclosure. The present disclosure may be practiced without some or all of these specific details. In other instances, well known process operations have not been described in detail to not unnecessarily obscure the present disclosure. While the disclosure will be described in conjunction with the specific embodiments, it will be understood that it is not intended to limit the disclosure to the embodiments.

Defects in wafers can be detected using high resolution, distributed probe inspection tools in the form of SEMs having one or multiple distributed miniature columns, multiple atomic force microscope (AFM) probes, a near-field microwave tool with multiple probes, ion beam probes, or multiple proximal optical probes.

Figure 1:
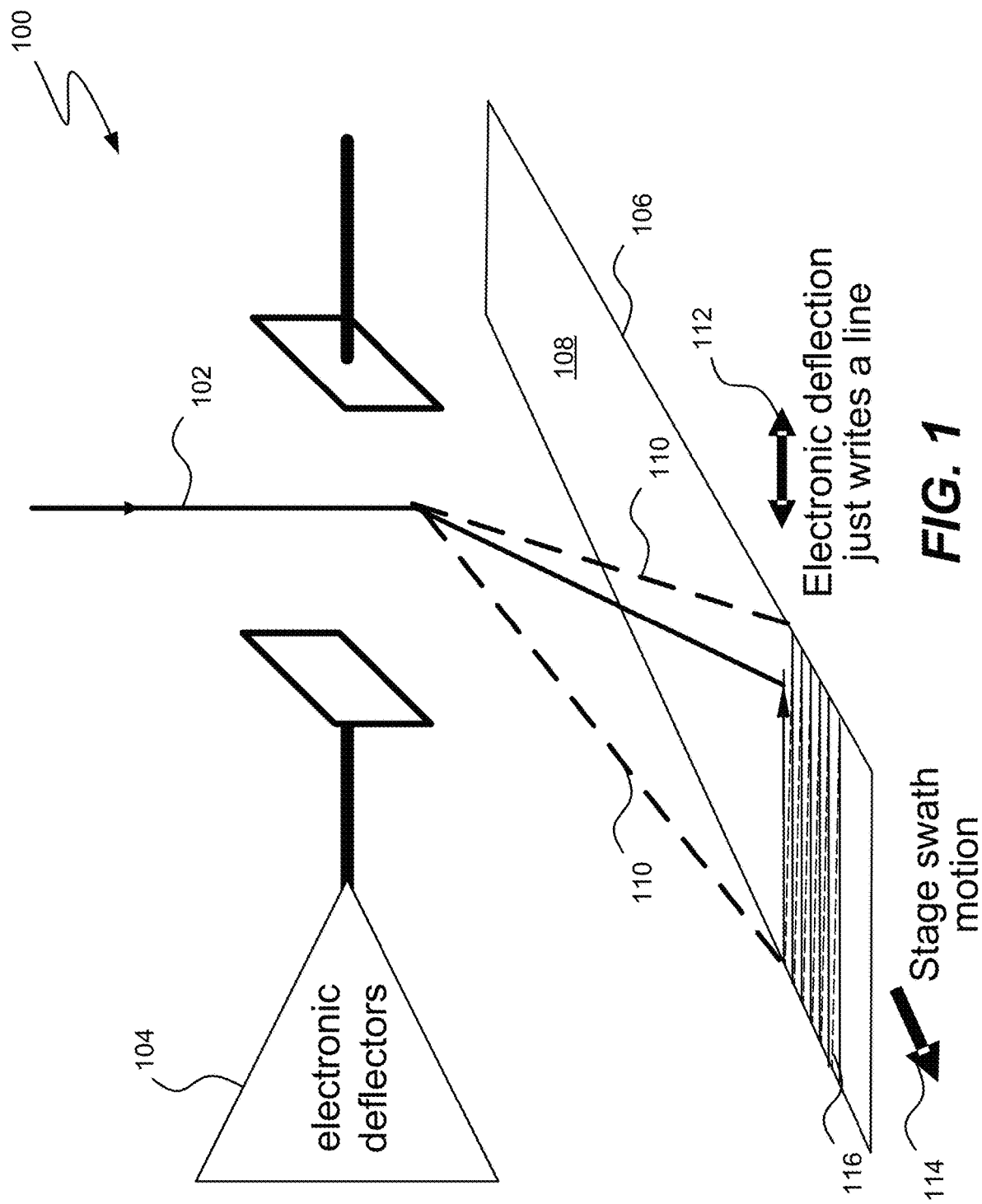
FIG. 1 illustrates an example single beam system with traditional swathing, in accordance with embodiments of the present disclosure.

Conventional electronics scanning typically involves a single beam, single axis deflector and a swathing stage that holds a sample, e.g., a wafer. FIG. 1 illustrates an example single beam system 100 with traditional swathing, in accordance with embodiments of the present disclosure. As shown in FIG. 1, a single electron beam 102 is emitted from a source and deflected by electronic deflectors 104. In some embodiments, electronic deflectors 104 comprise a single axis deflection system. As shown in FIG. 1, deflection system 104 deflects beam 102 in a direction 112 orthogonal to the direction of movement 114 of swathing stage 106 that holds a sample 108. In some embodiments, swathing stage 106 moves with a constant velocity. In some embodiments, the velocity is on the order of several millimeters per second. In some embodiments, in order to account for the constant velocity. Deflection system 104 actually deflects lines 116 in a diagonal direction which is substantially orthogonal to stage direction 114. As used herein, the term "substantially" refers to a vector component of 50% or more of the total sum of the vector components. For example, a first vector that is completely orthogonal to a base vector is still considered substantially orthogonal, as well as a second vector that forms a 45 degree angle with the base vector. This is because the second vector can be broken down into two vectors of equal magnitude, one that is parallel to the base vector and one that is orthogonal. However, a third vector that forms a 22.5 degree angle with the base vector is not considered substantially orthogonal because the component parallel to the base vector is twice the magnitude of the component in the orthogonal direction.

The single beam system 100 in FIG. 1 is capable of "writing" long scan lines. "Writing" scan lines refers to deflecting the electron beam to hit the sample and then moving the beam along a line in one direction. After hitting either of the edges 110 of the line (which can be the edge of the stage or sample or some predetermined stopping point for the line), the deflection system will retrace the electron beam to the starting position and start writing, or scanning, again. While single beam system 100 allows for larger write time to retrace time ratios, a single beam may not produce enough throughput and thus may not be the most efficient system for electron scanning a sample. Trying to scan an entire sample using a single beam system is similar to painting a wall with a single paint brush bristle.

Figure 2:
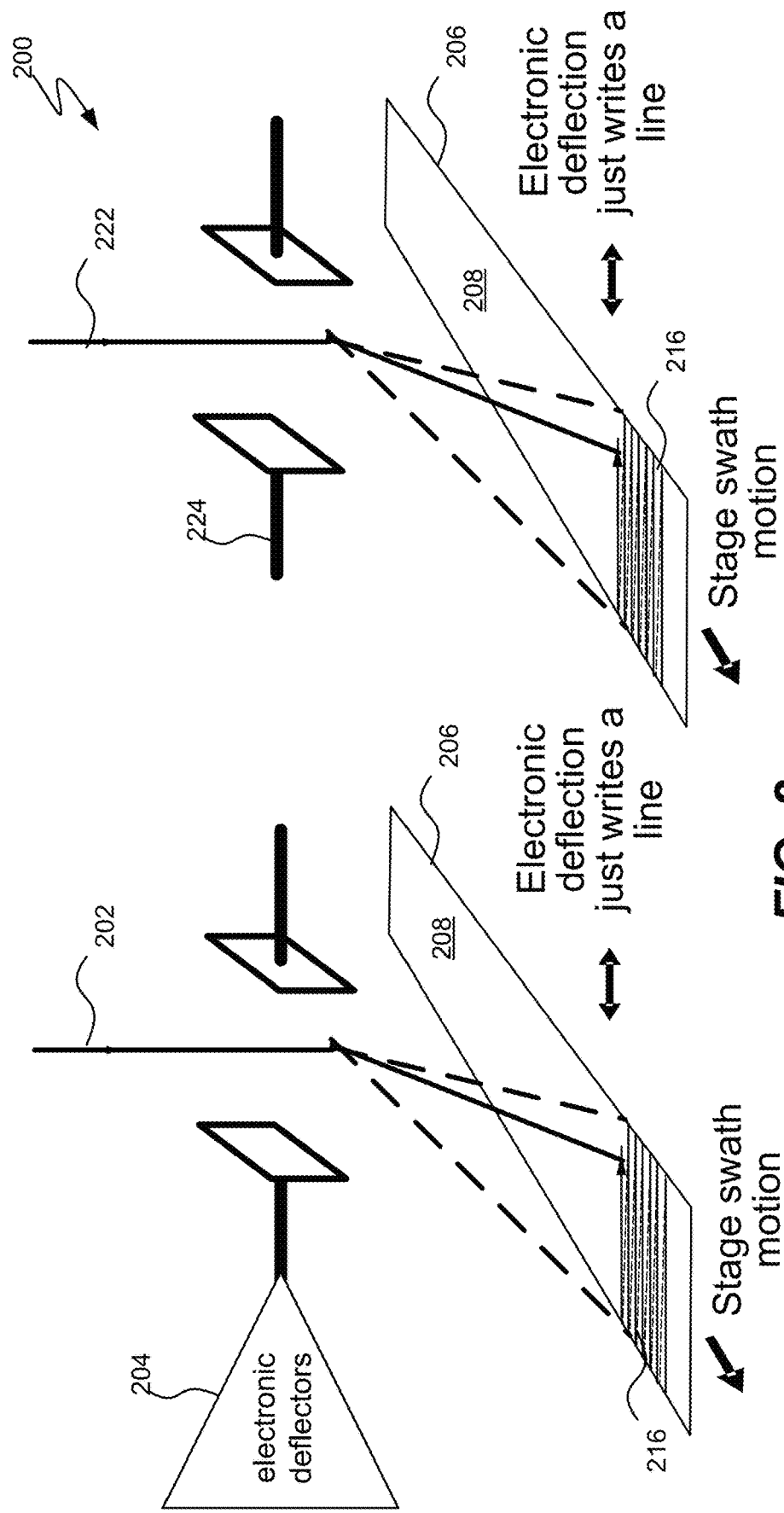
FIG. 2 illustrates an example multi-column system with traditional swathing, in accordance with embodiments of the present disclosure.

In some embodiments, since a single electron beam system may be insufficient, then a multi-column approach may address some of the deficiencies of system 100. FIG. 2 illustrates an example multi-column system 200 with traditional swathing, in accordance with embodiments of the present disclosure. System 200 is similar to system 100, except there are multiple electron beam columns writing simultaneously. Therefore, system 200 includes two different electron sources, each emitting a single beam, such as beams 202 and 222. Each column also includes its own deflectors, such as deflectors 204 and 224, for writing lines 216. It should be noted that FIG. 2 shows two separate sections of the same swathing stage 206 holding the same sample 208. However, separate sections of the stage are depicted in FIG. 2 because each of the columns is far away from another column. This is because each column requires other hardware, such as deflectors, and there is not enough space to fit multiple columns next to each other if the columns are spaced to close to one another. In addition, having multiple copies of the same hardware is more expensive from a fabrication and assembly standpoint, which leads to inefficiencies. Although the multi-column system 200 is an improvement over single beam system 100, scanning a sample with the multi-column system is similar to painting a wall with multiple individual paint brushes with only a single bristle per paint brush.

As described above, the single beam and multi-column systems have certain drawbacks. One approach for addressing these drawbacks is to use a multi-beam system, such as the one described in U.S. Pat. No. 8,362,425, which is hereby incorporated by reference in its entirety. Multi-beam systems allow for multiple beams to scan an area of a sample that is close together. However, because the beams in a multi-beam system are placed so close to together, traditional swathing using a multi-beam system leads to very small write time to retrace time ratios. Smaller ratios lead to less efficient writing/scanning system.

Figure 3A:
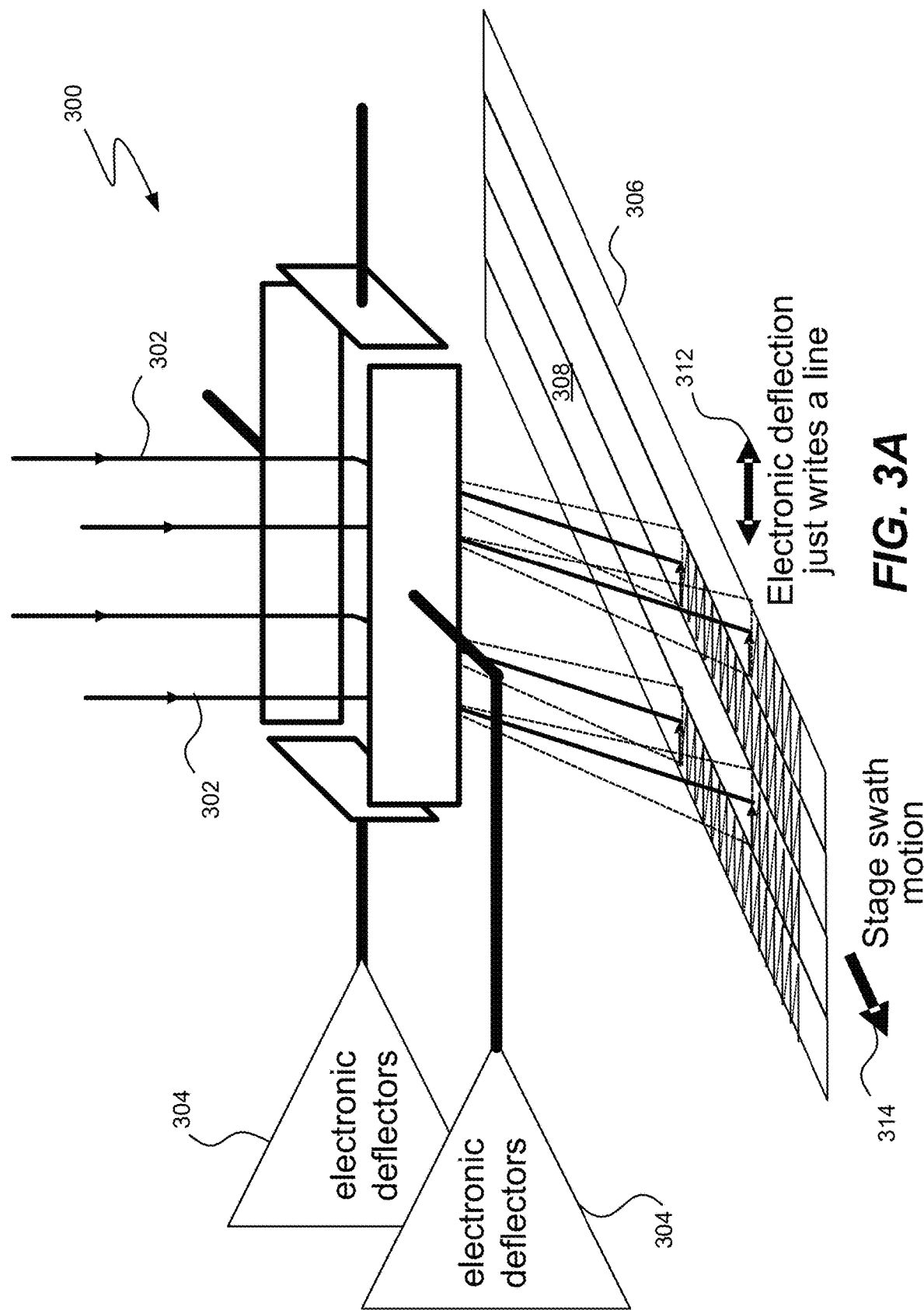
FIG. 3A is a diagram depicting a multi-beam system with traditional swathing, in accordance with embodiments of the present disclosure.

FIG. 3A is a diagram depicting a multi-beam system 300 with traditional swathing, in accordance with embodiments of the present disclosure. Multi-beam system 300 is similar to single beam system 100 except that an illumination beam is split into multiple beams 302 using a beam splitter. In addition, electronic deflectors 304 deflects each of the multiple beams 304 onto sample 308 which is located on swathing stage 306. As with system 100, swathing stage 306 is moving in direction 314 with a constant velocity. With traditional swathing, deflection system 304 writes a single line for each beam 304 in direction 312, which is orthogonal or substantially orthogonal to direction 314. However, since beams 304 are arranged in close proximity to one another, the width of the "line" written is much narrower than a "line" written in FIG. 1. Thus, the ratio of write time to retrace time is much smaller, thereby leading to inefficient writing or scanning.

Figure 3B:
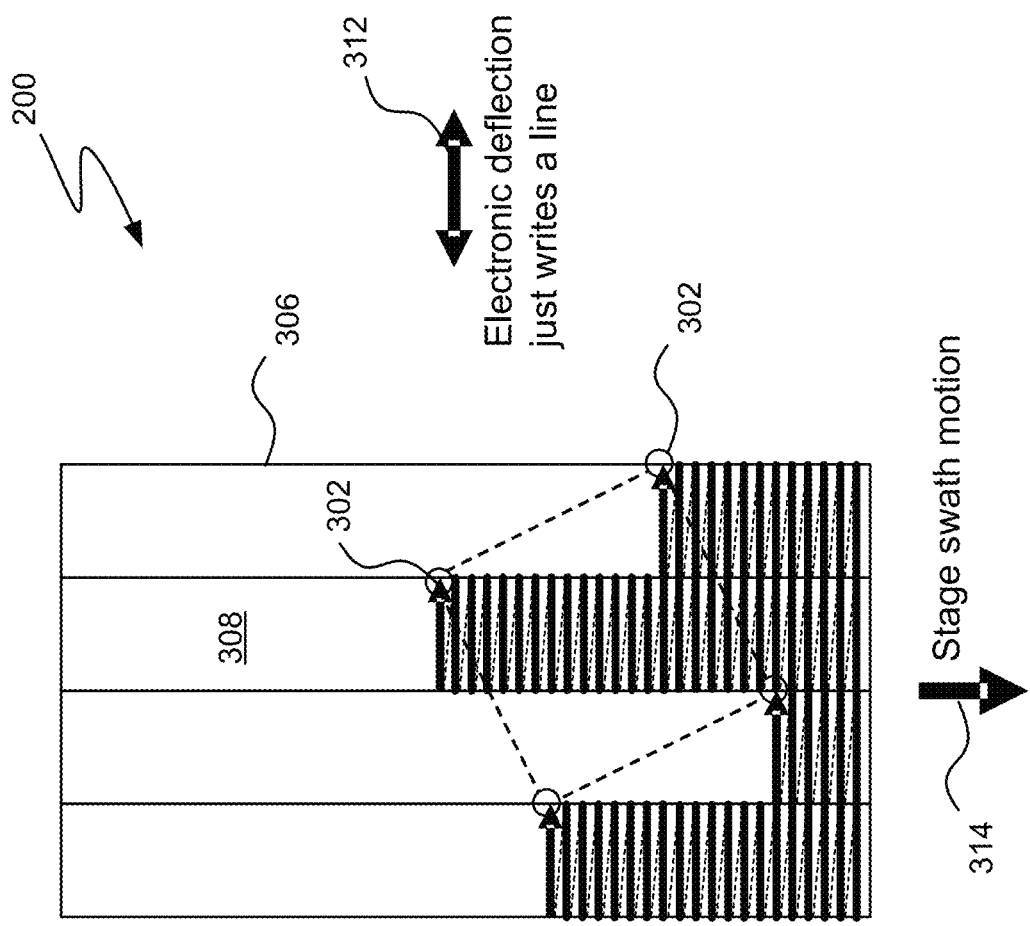
FIG. 3B is a top down view of a multi-beam system with traditional swathing, in accordance with embodiments of the present disclosure.

FIG. 3B is a top down view of multi-beam system 300 with traditional swathing, in accordance with embodiments of the present disclosure. The perspective of FIG. 3B is looking straight down on sample 308 and stage 306 from the perspective the emitter source. Beams 302 write straight lines from the perspective of the sample. Similar to system 100, the deflection system deflects each beam 302 at an angle to account for constant velocity of stage 306. As shown in FIG. 3B, each beam 302 writes its respective line in parallel or simultaneously with the other beams. Also as can be seen in FIG. 3B, due to the short width of the scan lanes, the retrace time is more significant in this configuration.

Because traditional swathing using a multi-beam system results in low write to retrace time ratios, other approaches may be considered. For example, multi-beam systems can utilize step-and-scan techniques. In some embodiments, a step-and-scan multi-beam system uses dual axis deflectors to scan a square frame on a sample sitting on a motionless stage. Then, after the square frame is scanned, the stage moves a predetermined amount to allow the deflection system to scan an adjacent square frame. This approach takes advantage of a dual axis deflection system and allows for 2 dimensional scanning. However, this approach has two drawbacks. First, the scanned square area can only be so big before encountering electronics and optics issues. Too large of square frames would result in noise and distortion. Second, because the sample and stage have actual real mass, starting the stage from a dead stop and then stopping the stage and waiting until the stage is motionless, including any vibrations caused by the movement, takes time and results in a delay on the order of several milliseconds. This delay is very costly from the perspective of electronics scanning. Thus, a multi-beam system that can address this deficiency would be very beneficial.

Figure 4A:
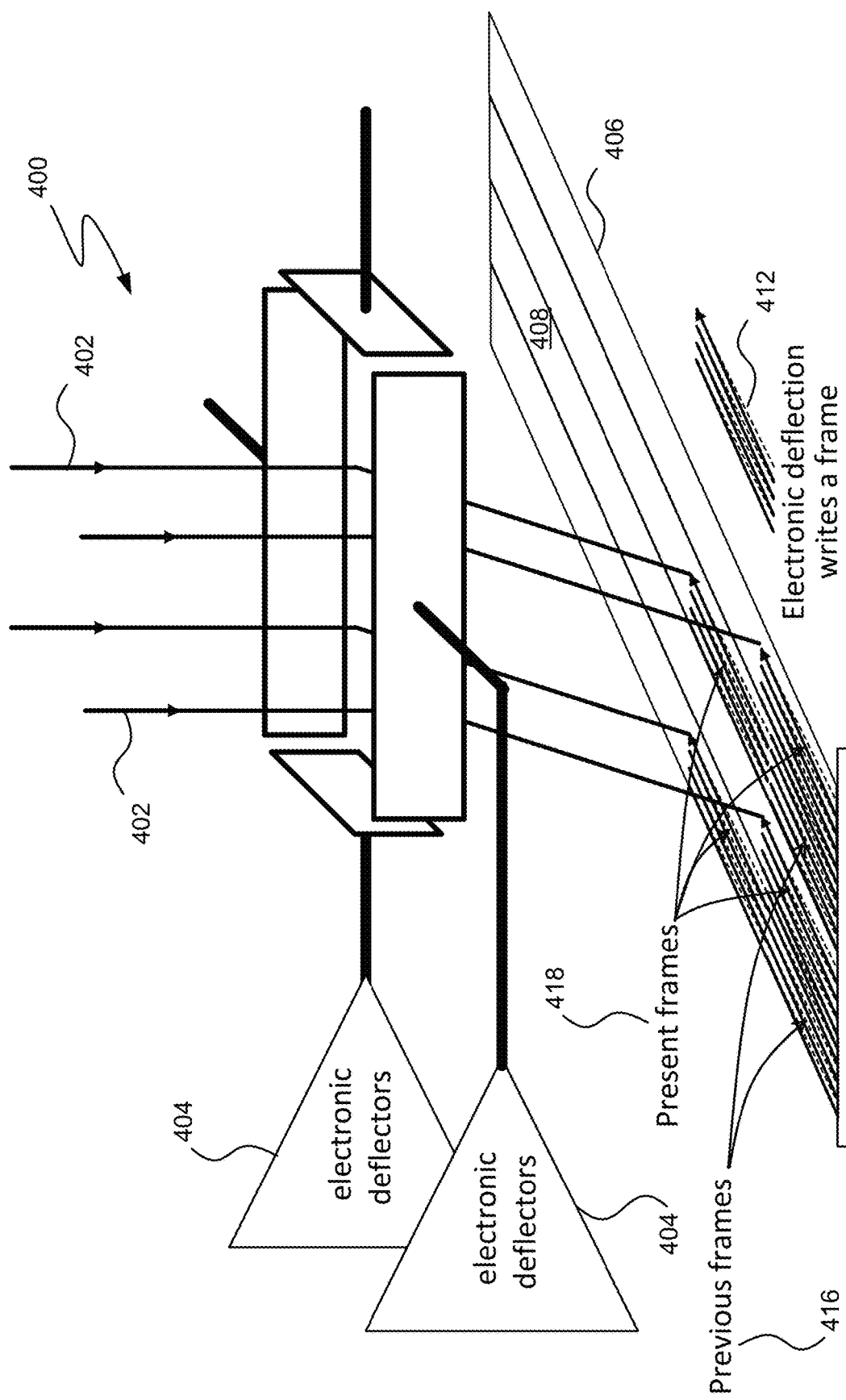
FIG. 4A is a diagram depicting a multi-beam system with parallel swathing, in accordance with embodiments of the present disclosure.

FIG. 4A is a diagram depicting a multi-beam system 400 with parallel swathing, in accordance with embodiments of the present disclosure. As with system 300, an emitter source emits an illumination beam that is split into multiple beams 402. Electronic deflectors 404 then deflect beams 402 onto a sample 408 on a swathing stage 406 moving in direction 414. In some embodiments, deflectors 404 comprise a dual axis deflection system configured to deflect beams 402 in a direction 412 parallel to direction 414. While electron deflection system 304 writes lines in a substantially orthogonal direction from direction 314, electron deflection system 404 writes frames in direction 412, which is comprised of lines parallel to direction 414. In some embodiments, each frame comprises a predetermined amount of lines and has predetermined dimensions based on the arrangement of beams 402. For example, if a system comprises a 10×10 array of beams spaced at 10 um pitch, the frame width "x" will be about 1 um and the length "y" can be as long as the scan electronics and optics can support, which in this case is 10 um. Assuming a pixel size of 5 nm, then the frame lines will have 2000 pixels in the "y" direction and 200 pixels in the "x" direction, which corresponds to 200 scan lines. Because the scan lines in the frames are much longer in length than the orthogonal lines in system 300, the ratio of write time to retrace time is much greater for system 400. Deflection system 404 is also configured to stack present frames 418 on top of previously written frames 416 in order to scan the entire sample 408. In some embodiments, the "fast" axis of the deflectors will be in the y-axis (e.g., parallel to the stage motion), and the "slow" axis will be in the x-axis. In some embodiments, the electronic raster-scan functions will be no different in form from that found in other typical SEMs; they are shaped as saw-tooth functions with a characteristic linear ramp region and a retrace time where the saw-tooth function resets. In other embodiments, the electronics raster-scan functions will be configured to raster scan in a serpentine motion rather than a saw-tooth motion such that each line adjacent to another line is written in the opposite direction from the other line. In such embodiments, the retrace time is reduced even further.

Figure 4B:
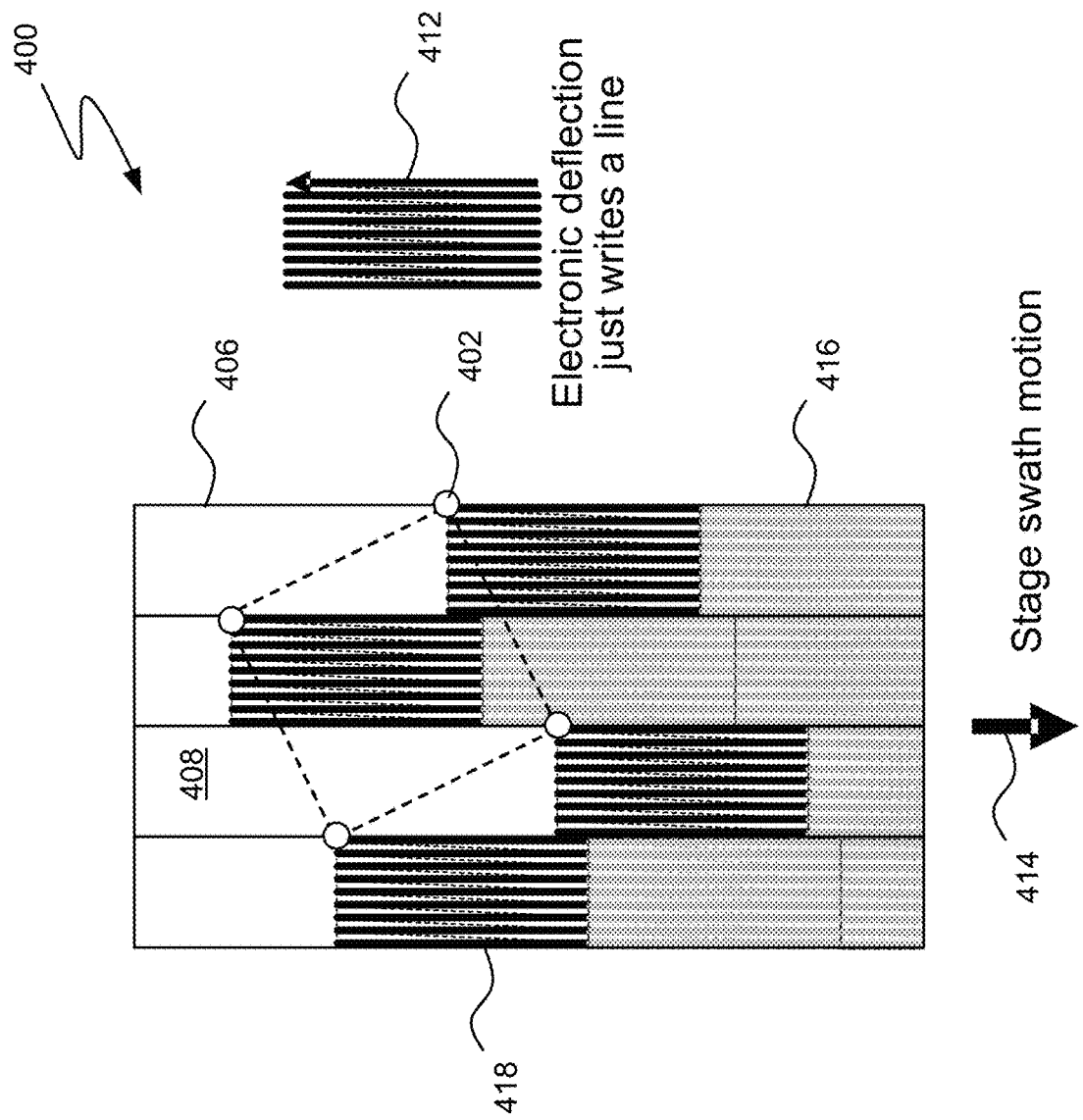
FIG. 4B is a top down view of a multi-beam system with parallel swathing, in accordance with embodiments of the present disclosure.

FIG. 4B is a top down view of multi-beam system 400 with parallel swathing, in accordance with embodiments of the present disclosure. As with FIG. 3B, FIG. 4B is a top down view from the perspective of the emitter source. Each rectangular frame is written by a beam 402. System 400 is configured to stack present frames 418 on top of previous frames 416. As with system 300, each beam 402 writes a line simultaneously with other beams 402.

Figure 5B:
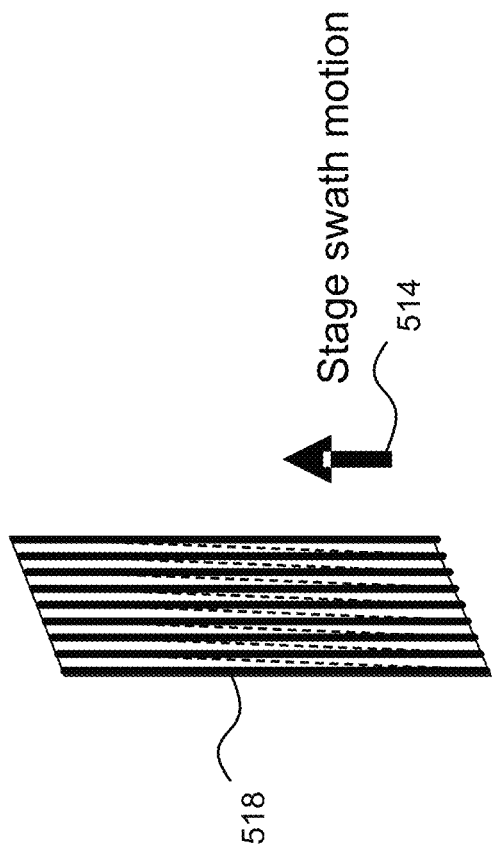
FIG. 5B illustrates one unit of swathing from the perspective of the deflection system, in accordance with embodiments of the present disclosure.
Figure 5A:
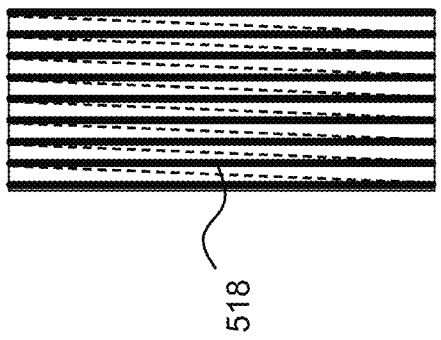
FIG. 5A illustrates one unit of swathing from the perspective of the sample, in accordance with embodiments of the present disclosure.

FIG. 5A illustrates one unit of swathing from the perspective of the sample, in accordance with embodiments of the present disclosure. Frame 518 looks like a rectangle from the perspective of the sample because the deflection system accounts for the movement of the stage. FIG. 5B illustrates one unit of swathing from the perspective of the deflection system, in accordance with embodiments of the present disclosure. Frame 518 resembles a parallelogram to account for the movement of the stage in direction 514.

In some embodiments, because the stage is continuously moving, each line has to counter for the shift that the stage has accumulated in the time that one line was written. In such embodiments, the actual video frame is not a rectangular frame, but rather, it is a parallelogram, whose tilt exactly counters the stage swath speed. In such embodiments, this will produce a rectangular image frame. In other embodiments, the scan electronics actually scans a rectangle. However, in such embodiments the actual image frames will be tiled parallelograms instead of rectangles. Systems that incorporate image frames that are parallelograms would need to include modifications to the image analysis algorithms in order to account for parallelogram shaped pixels, because standard image analysis algorithms typically assume square pixels.

Figure 6:
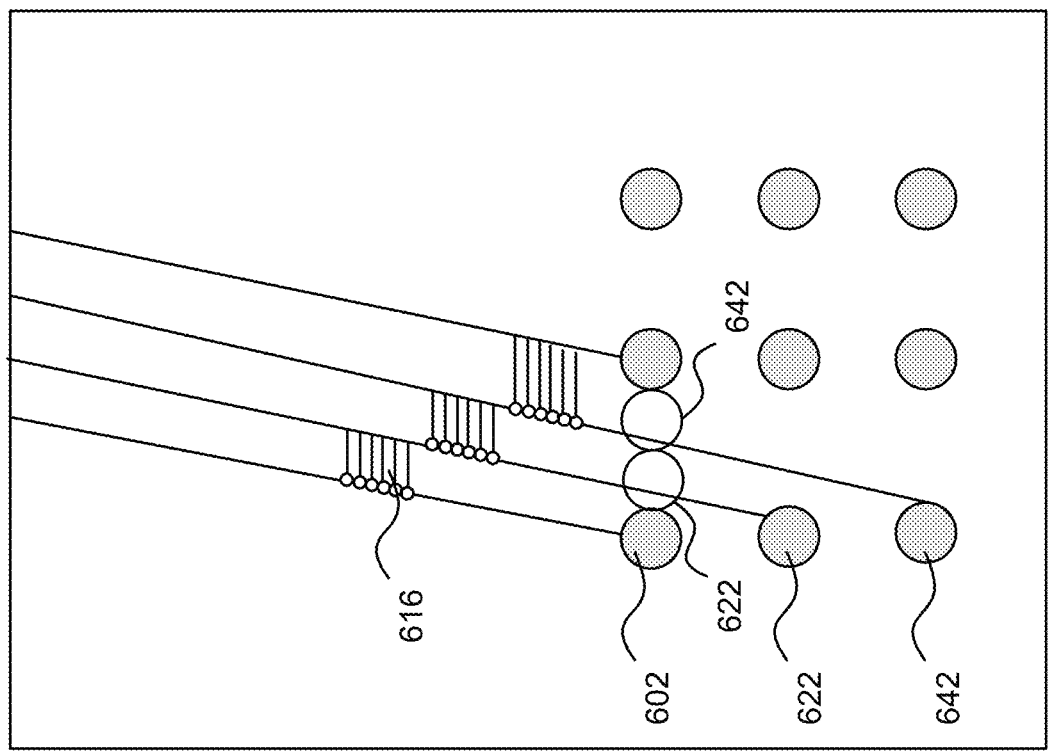
FIG. 6 illustrates scan line writing for the multi-beam system using traditional swathing, in accordance with embodiments of the present disclosure.
Figure 7:
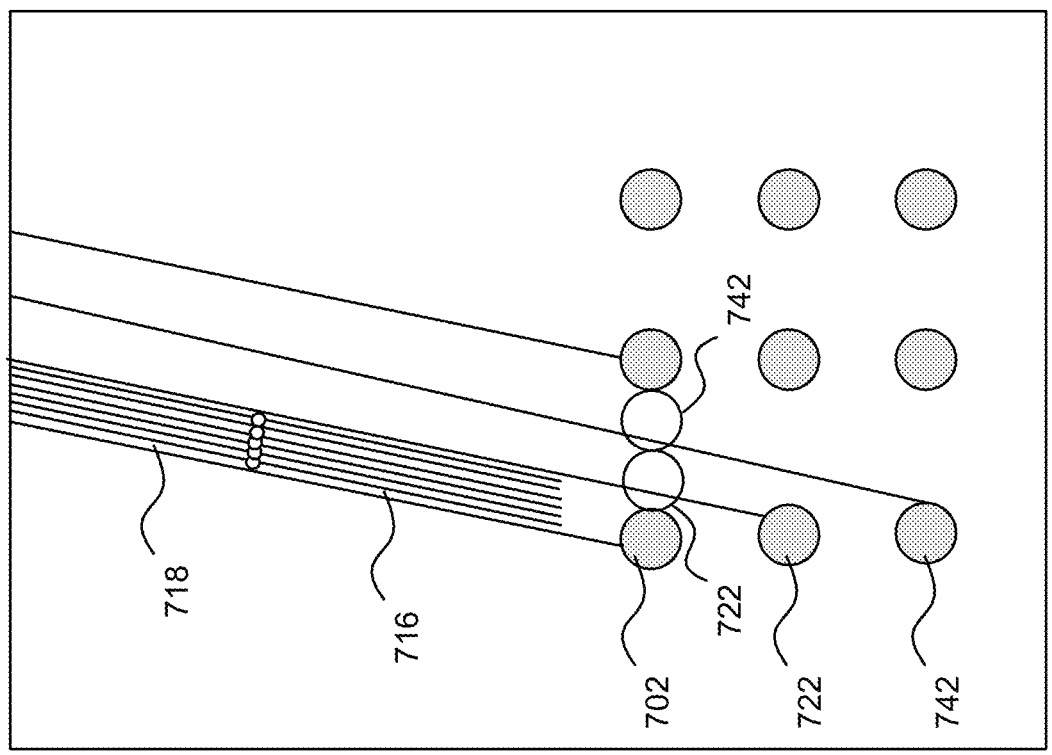
FIG. 7 illustrates scan line writing for the multi-beam system using parallel swathing, in accordance with embodiments of the present disclosure.

According to various embodiments, the width of the write lines or the frames vary depending on the physical arrangement of the multi-beam array. In some embodiments, a 2D arrangement of beams is essentially collapsed into a single dimension due to the movement of the swathing stage. FIG. 6 illustrates scan line writing for the multi-beam system using traditional swathing, in accordance with embodiments of the present disclosure. As shown in FIG. 6, although beams 622 and 624 are physically located vertically beneath beam 602, movement of the swathing stage effectively collapses the 2D arrangement into a single row of beams. The width of lines 616 are limited and/or defined by the physical arrangement of multi-beams. FIG. 7 illustrates scan line writing for the multi-beam system using parallel swathing, in accordance with embodiments of the present disclosure. The arrangement of the multi-beams is the same as in FIG. 6. The width of each rectangular frame 716 and 718 is defined by the arrangement of beams 702, 722, and 742. As with FIG. 6, the movement of the swathing stage effectively collapses the 2D arrangement of beams into a single row of beams. As can be seen in FIGS. 6 and 7, parallel swathing results in much more efficient scan lines.

Figure 8:
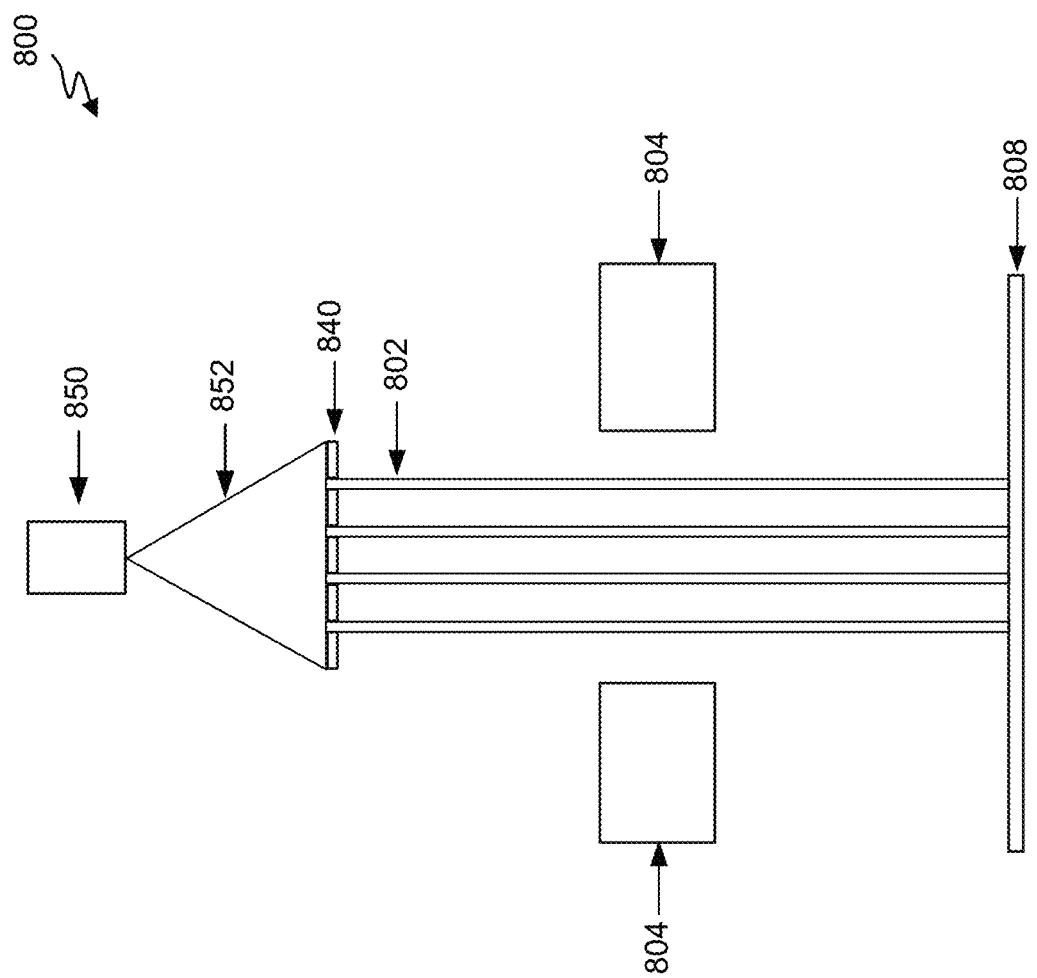
FIG. 8 illustrates an example of a multi-beam electronics scanning system, in accordance embodiments of the present disclosure.

FIG. 8 illustrates an example of a multi-beam electronics scanning system, in accordance embodiments of the present disclosure. System 800 includes electron emitter source 850. Electron emitter source 850 emits an illumination beam 852. System 800 also includes a beam splitter lens array 840 configured to split the illumination beam 852 into multiple electron beams 802. Multi-beams 802 are then deflected by electronic deflectors 804 onto sample 808. In some embodiments, electronic deflectors 804 are scan deflectors configured to scan samples using methods described above.

Figure 9:
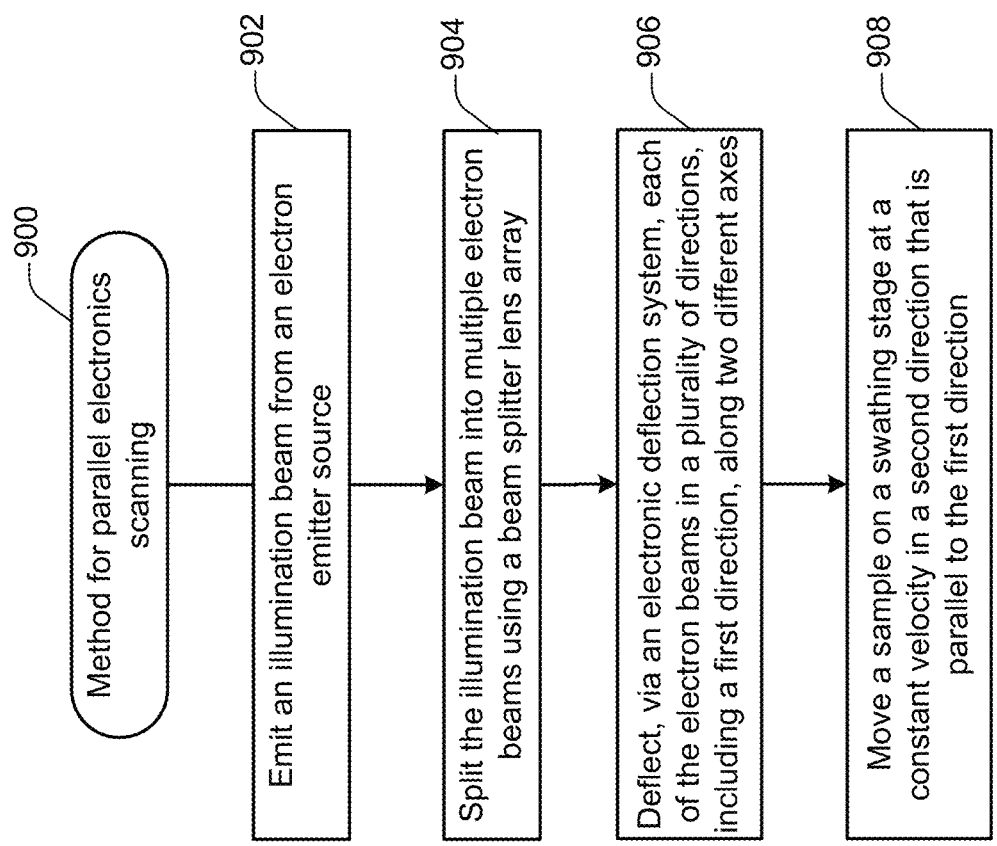
FIG. 9 is a flow diagram showing a method for parallel electronics scanning, in accordance embodiments of the present disclosure.

FIG. 9 is a flow diagram showing a method for parallel electronics scanning, in accordance embodiments of the present disclosure. Method 900 begins with emitting (902) an illumination beam from an electron emitter source. Then, the illumination beam is split (904) into multiple electron beams using a beam splitter lens array. Next, each of the electron beams is deflected (906), via an electronic deflection system, in a plurality of directions along two different axes. In some embodiments, the plurality of directions includes a first direction. Last, a sample is moved (908) on a swathing stage at a constant velocity in a second direction. In some embodiments, the second direction is parallel to the first direction.

In some embodiments, the electronic deflection system is further configured to deflect each electron beam along the first direction for a predetermined length of time or predetermined scanning distance. In some embodiments, the electronic deflection system is further configured such that after the electronic deflection system deflects an electron beam to the end of the predetermined length of time or predetermined scanning distance, the electronic deflection system will cause the electron beam to move in a third direction that is orthogonal or substantially orthogonal to the first direction. In some embodiments, the electronic deflection system is further configured such that after the electron beam moves in the third direction, the electronic deflection system causes the electron beam to move in a fourth direction that is parallel to the second direction. In some embodiments, the electronic deflection system is configured to write scan lines in groups of stacked rectangles from the perspective of the sample, wherein each rectangle comprises a predetermined number of scan lines. In some embodiments, each rectangle represents a scanned area of the sample, wherein each line adjacent to another line is written in the opposite direction from the other line. In some embodiments, each line is scanned in the same direction. In some embodiments, the rectangles are written as parallelograms from the perspective of the electronic deflection system to account for the constant velocity of the swathing stage.

Figure 10:
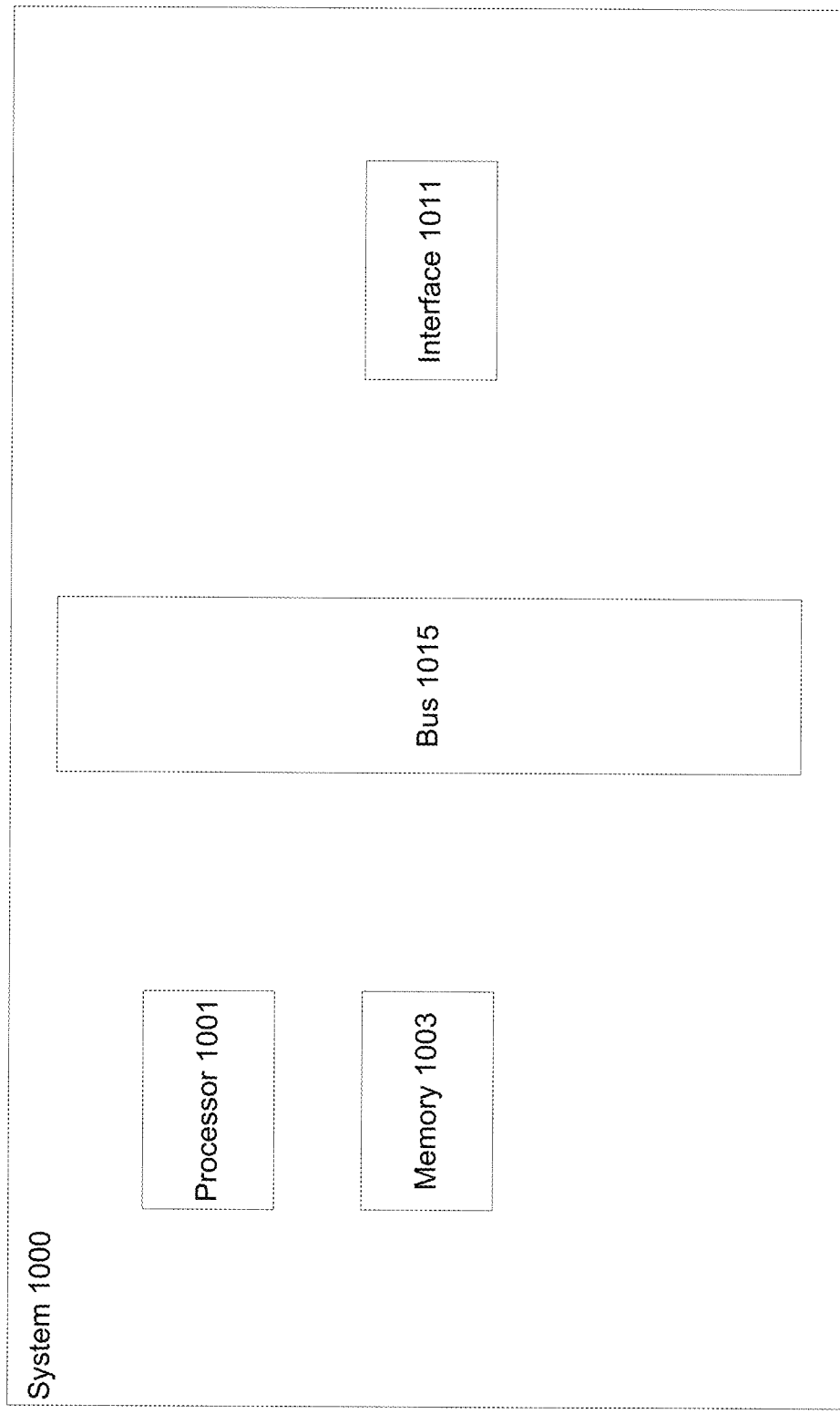
FIG. 10 illustrates an example of a computer system, in accordance embodiments of the present disclosure.

FIG. 10 illustrates one example of a computer system, in accordance with embodiments of the present disclosure. According to particular embodiments, a system 1000 suitable for implementing particular embodiments of the present disclosure includes a processor 1001, a memory 1003, an interface 1011, and a bus 1015 (e.g., a PCI bus or other interconnection fabric). When acting under the control of appropriate software or firmware, the processor 1001 is responsible for implementing applications such as an operating system kernel, a containerized storage driver, and one or more applications. Various specially configured devices can also be used in place of a processor 1001 or in addition to processor 1001. The interface 1011 is typically configured to send and receive data packets or data segments over a network.

Particular examples of interfaces supported include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control communications-intensive tasks such as packet switching, media control and management.

According to various embodiments, the system 1000 is a computer system configured to run electronics scanning system, as shown herein. In some embodiments, processor 1001 is configured to perform all steps in the methods described above, as well as any function or process described above or necessary to implement the processes described above. In some implementations, one or more of the computer components may be virtualized. For example, a physical server may be configured in a localized or cloud environment. The physical server may implement one or more virtual server environments in which the electronics scanning system is executed. Although a particular computer system is described, it should be recognized that a variety of alternative configurations are possible. For example, the modules may be implemented on another device connected to the computer system.

Certain embodiments of the present disclosure presented here generally address the field of semiconductor inspection and process control, and are not limited to the hardware, algorithm/software implementations and architectures, and use cases summarized above.

Although the foregoing disclosure has been described in some detail for purposes of clarity of understanding, it will be apparent that certain changes and modifications may be practiced within the scope of the appended claims. It should be noted that there are many alternative ways of implementing the processes, systems, and apparatus of the present disclosure. Accordingly, the present embodiments are to be considered as illustrative and not restrictive, and the disclosure is not to be limited to the details given herein.

What is claimed is:

1. A system comprising:
   an electron emitter source configured to emit an illumination beam;
   a beam splitter lens array configured to split the illumination beam into multiple electron beams;
   an electronic deflection system configured to deflect each of the electron beams in a plurality of directions, including a first direction, along two different axes; and
   a swathing stage configured to move a sample during writing of scan lines by the electronic beams with a constant velocity in a second direction that is parallel to the first direction, wherein the scan lines are written parallel to the second direction in a rectangular pattern by each of the electron beams, wherein a length of the rectangular pattern is measured along the first direction and the length is longer than a width of the rectangular pattern.

2. The system of claim 1, wherein the electronic deflection system is further configured to deflect each electron beam along the first direction for a predetermined length of time or predetermined scanning distance.

3. The system of claim 2, wherein the electronic deflection system is further configured such that after the electronic deflection system deflects an electron beam to the end of the predetermined length of time or predetermined scanning distance, the electronic deflection system will cause the electron beam to move in a third direction that is orthogonal or substantially orthogonal to the first direction.

4. The system of claim 3, wherein the electronic deflection system is further configured such that after the electron beam moves in the third direction, the electronic deflection system causes the electron beam to move in a fourth direction that is parallel to the second direction.

5. The system of claim 1, wherein the electronic deflection system is configured to write scan lines in groups of stacked rectangles from the perspective of the sample, wherein each rectangle comprises a predetermined number of scan lines.

6. The system of claim 5, wherein each rectangle represents a scanned area of the sample, wherein each line adjacent to another line is written in the opposite direction from the other line.

7. The system of claim 6, wherein the rectangles are written as parallelograms from the perspective of the electronic deflection system to account for constant velocity of the swathing stage.

8. A method comprising:
emitting an illumination beam from an electron emitter source;
splitting the illumination beam into multiple electron beams using a beam splitter lens array;
deflecting, via an electronic deflection system, each of the electron beams in a plurality of directions, including a first direction, along two different axes; and
moving a sample during writing of scan lines by the electronic beams with a constant velocity in a second direction that is parallel to the first direction, wherein the scan lines are written parallel to the second direction in a rectangular pattern by each of the electron beams, wherein a length of the rectangular pattern is measured along the first direction and the length is longer than a width of the rectangular pattern.

9. The method of claim 8, wherein the electronic deflection system is further configured to deflect each electron beam along the first direction for a predetermined length of time or predetermined scanning distance.

10. The method of claim 9, wherein the electronic deflection system is further configured such that after the electronic deflection system deflects an electron beam to the end of the predetermined length of time or predetermined scanning distance, the electronic deflection system will cause the electron beam to move in a third direction that is orthogonal or substantially orthogonal to the first direction.

11. The method of claim 10, wherein the electronic deflection system is further configured such that after the electron beam moves in the third direction, the electronic deflection system causes the electron beam to move in a fourth direction that is parallel to the second direction.

12. The method of claim 8, wherein the electronic deflection system is configured to write scan lines in groups of stacked rectangles from the perspective of the sample, wherein each rectangle comprises a predetermined number of scan lines.

13. The method of claim 12, wherein each rectangle represents a scanned area of the sample, wherein each line adjacent to another line is written in the opposite direction from the other line.

14. The method of claim 13, wherein the rectangles are written as parallelograms from the perspective of the electronic deflection system to account for constant velocity of the swathing stage.

15. A non-transitory computer readable medium storing instructions to cause a computer processor to execute a method, the method comprising:
emitting an illumination beam from an electron emitter source;
splitting the illumination beam into multiple electron beams using a beam splitter lens array;
deflecting, via an electronic deflection system, each of the electron beams in a plurality of directions, including a first direction, along two different axes; and
moving a sample during writing of scan lines by the electronic beams with a constant velocity in a second direction that is parallel to the first direction, wherein the scan lines are written parallel to the second direction in a rectangular pattern by each of the electron beams, wherein a length of the rectangular pattern is measured along the first direction and the length is longer than a width of the rectangular pattern.

16. The non-transitory computer readable medium of claim 15, wherein the electronic deflection system is further configured to deflect each electron beam along the first direction for a predetermined length of time or predetermined scanning distance.

17. The non-transitory computer readable medium of claim 16, wherein the electronic deflection system is further configured such that after the electronic deflection system deflects an electron beam to the end of the predetermined length of time or predetermined scanning distance, the electronic deflection system will cause the electron beam to move in a third direction that is orthogonal or substantially orthogonal to the first direction.

18. The non-transitory computer readable medium of claim 17, wherein the electronic deflection system is further configured such that after the electron beam moves in the third direction, the electronic deflection system causes the electron beam to move in a fourth direction that is parallel to the second direction.

19. The non-transitory computer readable medium of claim 15, wherein the electronic deflection system is configured to write scan lines in groups of stacked rectangles from the perspective of the sample, wherein each rectangle comprises a predetermined number of scan lines.

20. The non-transitory computer readable medium of claim 19, wherein each rectangle represents a scanned area of the sample, wherein each line adjacent to another line is written in the opposite direction from the other line.

* * * * *